(12) United States Patent
Chang et al.

(10) Patent No.: US 9,331,266 B2
(45) Date of Patent: May 3, 2016

(54) MAGNETIC FIELD CONTROLLED RECONFIGURABLE SEMICONDUCTOR LOGIC DEVICE AND METHOD FOR CONTROLLING THE SAME

(71) Applicants: KOREA INSTITUTE OF SCIENCE AND TECHNOLOGY, Seoul (KR); THE UNITED STATES OF AMERICA, AS REPRESENTED BY THE SECRETARY OF THE NAVY, Arlington, VA (US)

(72) Inventors: Joon Yeon Chang, Seoul (KR); Jin Ki Hong, Seoul (KR); Jin Dong Song, Seoul (KR); Mark Johnson, Potomac, MD (US)

(73) Assignees: KOREA INSTITUTE OF SCIENCE AND TECHNOLOGY, Seoul (KR); THE UNITED STATES OF AMERICA, AS REPRESENTED BY THE SECRETARY OF THE NAVY, Washington, DC (US)

( * ) Notice: Subject to any disclaimer, the term of this patent is extended or adjusted under 35 U.S.C. 154(b) by 160 days.

(21) Appl. No.: 14/132,492

(22) Filed: Dec. 18, 2013

(65) Prior Publication Data

US 2014/0167814 A1 Jun. 19, 2014

(30) Foreign Application Priority Data

Dec. 18, 2012 (KR) .......................... 10-2012-0147963

(51) Int. Cl.
*H03K 19/173* (2006.01)
*H01L 43/02* (2006.01)
(Continued)

(52) U.S. Cl.
CPC .............. *H01L 43/02* (2013.01); *G11C 11/161* (2013.01); *H01L 27/22* (2013.01); *H01L 43/08* (2013.01); *H03K 19/017581* (2013.01); *H03K 19/16* (2013.01)

(58) Field of Classification Search
CPC ....... G11C 11/161; H01L 43/08; H03K 19/16
See application file for complete search history.

(56) References Cited

U.S. PATENT DOCUMENTS 5,432,373 A * 7/1995 Johnson ................. B82Y 25/00
257/421
6,178,112 B1 * 1/2001 Bessho .................. G11C 11/22
257/E43.004

(Continued)

FOREIGN PATENT DOCUMENTS

JP 2010-225885 A 10/2010
KR 10-2006-0048384 A 5/2006
(Continued)

OTHER PUBLICATIONS

Joo, Sungjung, et al. "Magnetic-field-controlled reconfigurable semiconductor logic." *Nature* 494.7435 (2013): 72-76.

*Primary Examiner* — Jason M Crawford
(74) *Attorney, Agent, or Firm* — NSIP Law

(57) ABSTRACT

A non-volatile reconfigurable logic device executing logical operations and a memory function and controlled by a magnetic field is provided. The reconfigurable logic device includes i) at least one semiconductor device; and ii) a pair of magnetic field controlled devices respectively spaced apart from both sides of the semiconductor device and that are adapted to generate magnetic field leakage to control the semiconductor device. The semiconductor device includes i) a first semiconductor layer; and ii) a second semiconductor layer located on the first semiconductor layer. One of the first semiconductor layer and the second semiconductor layer is a p-type semiconductor layer and the other is an n-type semiconductor layer.

27 Claims, 10 Drawing Sheets

(51) Int. Cl.
*H01L 27/22* (2006.01)
*H03K 19/0175* (2006.01)
*H03K 19/16* (2006.01)
*H01L 43/08* (2006.01)
*G11C 11/16* (2006.01)

(56) References Cited

U.S. PATENT DOCUMENTS

| | | | | |
|---|---|---|---|---|
| 7,411,235 | B2 * | 8/2008 | Saito | B82Y 10/00 257/295 |
| 7,608,901 | B2 * | 10/2009 | Koo | G11C 11/16 257/421 |
| 7,652,315 | B2 | 1/2010 | Saito et al. | |
| 7,960,755 | B2 | 6/2011 | Phillips et al. | |
| 8,004,029 | B2 | 8/2011 | Saito et al. | |
| 8,237,236 | B2 | 8/2012 | Song et al. | |
| 8,264,024 | B2 | 9/2012 | Saito et al. | |
| 2006/0028863 | A1 * | 2/2006 | Chung | G11C 11/14 365/158 |
| 2007/0059877 | A1 * | 3/2007 | Koo | H01F 10/193 438/213 |
| 2009/0302293 | A1 | 12/2009 | Morikawa et al. | |
| 2011/0279146 | A1 * | 11/2011 | Koo | B82Y 10/00 326/100 |
| 2013/0077388 | A1 * | 3/2013 | Inokuchi | G11C 11/16 365/158 |
| 2014/0010004 | A1 * | 1/2014 | Suzuki | H01L 27/228 365/158 |

FOREIGN PATENT DOCUMENTS

| | | |
|---|---|---|
| KR | 10-2006-0094980 A | 8/2006 |
| KR | 10-0619300 B1 | 9/2006 |
| KR | 10-0832583 B1 | 5/2008 |
| KR | 10-1041372 B1 | 6/2011 |

* cited by examiner

MAGNETIC FIELD CONTROLLED RECONFIGURABLE SEMICONDUCTOR LOGIC DEVICE AND METHOD FOR CONTROLLING THE SAME

CROSS-REFERENCE TO RELATED APPLICATION

This application claims priority to and the benefit of Korean Patent Application No. 10-2012-0147963 filed in the Korean Intellectual Property Office on Dec. 18, 2012, the entire contents of which are incorporated herein by reference.

BACKGROUND OF THE INVENTION (a) Field of the Invention

The present invention relates to a magnetic field controlled reconfigurable semiconductor logic device. More specifically, the present invention relates to a magnetic field controlled nonvolatile reconfigurable semiconductor logic device which executes logical operations and a memory function.

(b) Description of the Related Art

Recently, a variety of potable information devices such as tablet PC (personal computer), smartphones, etc. have been developed. Development of these portable information devices is based on miniaturization and high performance of logic devices (transistors) and memories which are basic elements of a computer circuit. Particularly, logic devices and switching devices based on semiconductors are important and have high added value because they execute complicated functions in integrated circuits.

The conventional computer is of Neumann type in which a logical circuit and a memory circuit are independently provided. Accordingly, bottlenecks occur during signal transmission between an operation circuit and a memory circuit, and thus it is difficult to achieve high performance of the computer even if performances of the logic devices and memory devices are improved. Therefore, researches on a reconfigurable nonvolatile semiconductor logic device which executes an operation function and a memory function in the same circuit are being performed. The reconfigurable nonvolatile semiconductor logic device is reconfigured to store information or use an operation result during a logical operation. Accordingly, a computer which does not require booting time can be implemented using the nonvolatile reconfigurable semiconductor logic device.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a magnetic field controlled nonvolatile reconfigurable semiconductor logic device having advantages of executing logical operations and a memory function. An exemplary embodiment of the present invention provides a method for controlling the reconfigurable semiconductor logic device.

The reconfigurable logic device includes i) at least one semiconductor device; and ii) a pair of magnetic field controlled devices respectively spaced apart from both sides of the semiconductor device and that are adapted to generate magnetic field leakage to control the semiconductor device. The semiconductor device includes i) a first semiconductor layer; and ii) a second semiconductor layer located on the first semiconductor layer. One of the first semiconductor layer and the second semiconductor layer is a p-type semiconductor layer and the other is an n-type semiconductor layer.

At least one magnetic field controlled devices of the pair of magnetic field controlled devices may include i) a first magnetic layer having a fixed magnetization direction; ii) a non-magnetic layer located on the first magnetic layer; and iii) a second magnetic layer located on the non-magnetic layer and having a reversible magnetization direction. An electron carrier concentration in the first and second semiconductor layers may increase by an impact ionization process, the electron carrier concentration may decrease by recombination of holes and electrons at the interface of the first and second semiconductor layers to change the recombination according to a direction to which the magnetic field leakage is applied, and electric fields of the first and second semiconductor layers may be generated in opposite directions to each other by the magnetic field leakage. The first and second semiconductor layers may include InSb, and the magnetic field leakage application direction may be substantially perpendicular to the electric field generation directions.

A distance between at least one of the magnetic field controlled devices of the pair of magnetic field controlled devices and the semiconductor device may be more than 0 nm and not more than 500 nm. A current may be injected into the magnetic field controlled devices through the first magnetic layer, the non-magnetic layer, and the second magnetic layer, and the current injection direction may be reversible.

The reconfigurable logic device according to an exemplary embodiment of the present invention may further include a shielding structure in contact with the semiconductor device and the pair of magnetic field controlled devices to block the magnetic field leakage from being leaked outside. The at least one semiconductor device may include two semiconductor devices connected to each other in a parallel manner, and one of the two semiconductor devices may include a p-type semiconductor layer and an n-type semiconductor layer located thereon and the other of the two semiconductor devices may include an n-type semiconductor layer and a p-type semiconductor layer located thereon. The reconfigurable logic device according to an exemplary embodiment of the present invention may further include two power sources respectively connected to the two semiconductor devices. The at least one semiconductor device may include a pair of the same first semiconductor devices and a pair of the same second semiconductor devices, wherein the pair of the same first semiconductor devices and the pair of the same second semiconductor devices may be connected to each other in a parallel manner, and wherein one pair of the pair of the same first semiconductor devices and the pair of the same second semiconductor devices may include a p-type semiconductor layer and an n-type semiconductor layer located thereon and the other pair of the pair of the same first semiconductor devices and the pair of the same second semiconductor devices may include an n-type semiconductor layer and a p-type semiconductor layer located thereon.

The p-type first semiconductor layer may have a thickness of not more than 10 µm, and the n-type second semiconductor layer may have a thickness in a range of 0.1 µm to 10 µm.

A method for controlling a reconfigurable logic device according to an exemplary embodiment of the present invention includes i) providing at least one semiconductor device; ii) providing a pair of magnetic field controlled devices on both sides of the semiconductor device, the pair of magnetic field controlled devices being spaced apart from the semiconductor device; and iii) generating a magnetic field by the magnetic field controlled devices to control the semiconductor device. The providing of the at least one semiconductor device may include i) providing a first semiconductor layer and ii) providing a second semiconductor layer on the first semiconductor layer. One of the first semiconductor layer and the second semiconductor layer may be a p-type semiconductor layer and the other of the first semiconductor layer and the second semiconductor layer may be an n-type semiconductor layer.

The magnetic field may be applied to the semiconductor device in a positive direction or a negative direction along a direction parallel with the surface of the semiconductor device. A method for controlling a reconfigurable logic device according to an exemplary embodiment of the present invention further includes applying a voltage to the semiconductor device, and the voltage applied to the semiconductor device may be higher than a threshold voltage of the semiconductor device when the positive direction magnetic field is applied and lower than a threshold voltage of the semiconductor device when the negative direction magnetic field is applied. The first semiconductor layer of the semiconductor device may be an n-type semiconductor and the second semiconductor layer thereof may be a p-type semiconductor. The at least one semiconductor device may include two semiconductor devices serially connected to each other in the providing of at least one semiconductor device, and the amount of current of the reconfigurable semiconductor logic device when the positive direction magnetic field is applied to both of the two semiconductor devices may be greater than the amount of current of the reconfigurable semiconductor logic device when the negative direction magnetic field is applied to at least one of the two semiconductor devices.

The at least one semiconductor device may include two semiconductor devices serially connected to each other in the providing of at least one semiconductor device. The amount of current of the reconfigurable semiconductor logic device when the negative direction magnetic field is applied to both of the two semiconductor devices may be less than the amount of current of the reconfigurable semiconductor logic device when the positive direction magnetic field is applied to at least one of the two semiconductor devices.

The at least one semiconductor device may include two semiconductor devices connected to each other in a parallel manner in the providing of at least one semiconductor device, and one of the two semiconductor devices includes a p-type semiconductor layer and an n-type semiconductor layer located thereon, and the other includes an n-type semiconductor layer and a p-type semiconductor layer located thereon. A voltage may be applied only to the semiconductor device including the n-type semiconductor layer located on the p-type semiconductor layer among the two semiconductor devices, and the amount of current of the reconfigurable semiconductor logic device when the negative direction magnetic field is applied to the semiconductor device is less than the amount of current of the reconfigurable semiconductor logic device when the positive direction magnetic field is applied to the semiconductor device.

The at least one semiconductor device may include two semiconductor devices connected to each other in a parallel manner in the providing of at least one semiconductor device, wherein one of the two semiconductor devices may include a p-type semiconductor layer and an n-type semiconductor layer located thereon, and the other may include an n-type semiconductor layer and a p-type semiconductor layer located thereon. A voltage may be applied only to the semiconductor device including the p-type semiconductor layer located on the n-type semiconductor layer among the two semiconductor devices, and the amount of current of the reconfigurable semiconductor logic device when the positive direction magnetic field is applied to the semiconductor device may be less than the amount of current of the reconfigurable semiconductor logic device when the negative direction magnetic field is applied to the semiconductor device.

A method for controlling a reconfigurable logic device according to an exemplary embodiment of the present invention may further include applying a voltage to the semiconductor device, and the voltage applied to the semiconductor device may be higher than a threshold voltage of the semiconductor device when the negative direction magnetic field is applied and lower than a threshold voltage of the semiconductor device when the positive direction magnetic field is applied. The first semiconductor layer of the semiconductor device may be a p-type semiconductor layer and the second semiconductor layer thereof may be an n-type semiconductor layer.

A method for controlling a reconfigurable logic device according to an exemplary embodiment of the present invention may further include applying a voltage to the semiconductor device, and the voltage applied to the semiconductor device may be higher than a threshold voltage of the semiconductor device when the negative direction magnetic field is applied and lower than a threshold voltage of the semiconductor device when the positive direction magnetic field is applied. A method for controlling a reconfigurable logic device according to an exemplary embodiment of the present invention may further include providing a pair of reconfigurable semiconductor logic devices serially connected to each other, and the at least one semiconductor device may include two semiconductor devices serially connected to each other in the providing of at least one semiconductor device. A voltage may be applied only to the semiconductor device including the p-type semiconductor layer located on the n-type semiconductor layer among the two semiconductor devices. The amount of current of the reconfigurable semiconductor logic device when the negative direction magnetic field is applied to both of the two semiconductor devices may be greater than the amount of current of the reconfigurable semiconductor logic device when the positive direction magnetic field is applied to at least one of the two semiconductor devices.

A method for controlling a reconfigurable logic device according to an exemplary embodiment of the present invention may further include providing a pair of reconfigurable semiconductor logic devices serially connected to each other, and the at least one semiconductor device may include two semiconductor devices serially connected to each other in the providing of at least one semiconductor device. A voltage may be applied only to the semiconductor device including the p-type semiconductor layer located on the n-type semiconductor layer from the two semiconductor devices, and the amount of current of the reconfigurable semiconductor logic device when the positive direction magnetic field is applied to both of the two semiconductor devices may be less than the amount of current of the reconfigurable semiconductor logic device when the negative direction magnetic field is applied to at least one of the two semiconductor devices. The providing of the pair of magnetic field controlled devices may include i) providing a first magnetic layer having a fixed magnetization direction; ii) providing a non-magnetic layer on the first magnetic layer; and iii) providing a second magnetic layer having a reversible magnetization direction on the non-magnetic layer. The direction of current sequentially injected into the magnetic field controlled devices through the first magnetic layer, the non-magnetic layer, and the second magnetic layer may be reversed.

DETAILED DESCRIPTION OF THE EMBODIMENTS

Figure 1:
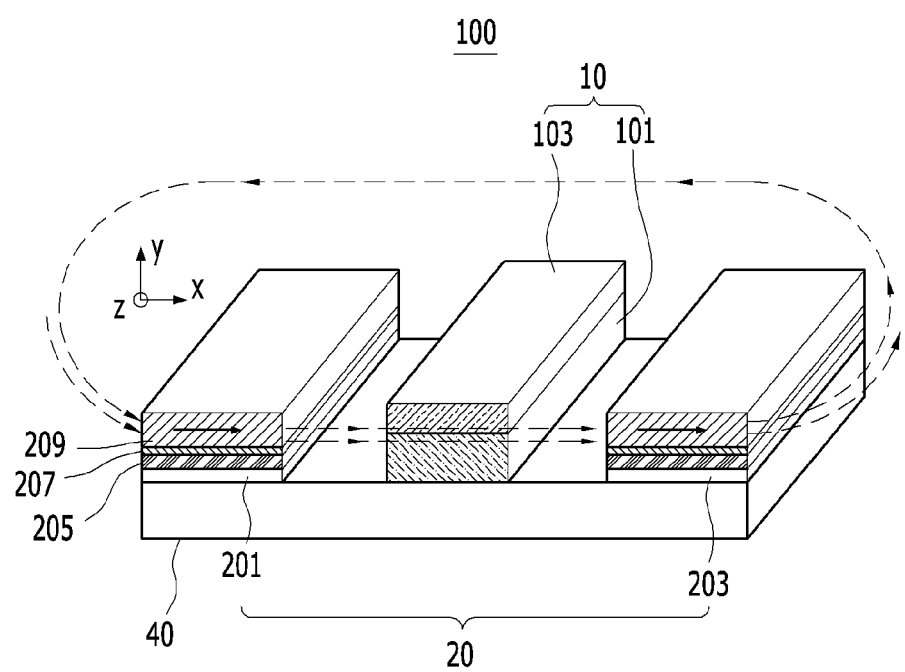
FIG. 1 schematically illustrates a reconfigurable semiconductor logic device according to a first exemplary embodiment of the present invention.

In the following description of the embodiments, it will be understood that, when an element is referred to as being "on" another element, it can be "directly" on another element or can be "indirectly" formed such that an intervening element is also present. When an element is referred to as being "directly on" another element, no element is present between the two elements.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

The terminology used herein is only for the purpose of describing particular embodiments and is not intended to be limiting of the invention. As used herein, the singular forms "a", "an", and "the" are intended to include the plural forms as well, unless the context clearly indicates otherwise. It will be further understood that the terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary terms "below" or "beneath" can, therefore, encompass both an orientation of above and below. A device can be rotated by 90° or other angles and the term representing a relative space is interpreted according to rotation.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and are not to be interpreted in an idealized or overly formal sense unless expressly so defined herein.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

FIG. 1 schematically illustrates a reconfigurable semiconductor logic device 100 according to a first exemplary embodiment of the present invention. The structure of the reconfigurable semiconductor logic device 100 shown in FIG. 1 is merely to exemplify the present invention, and the present invention is not limited thereto. Accordingly, the structure of the reconfigurable semiconductor logic device 100 can be varied in various manners.

As shown in FIG. 1, the reconfigurable semiconductor logic device 100 includes a semiconductor device 10 and a pair of magnetic field controlled devices 20. The pair of magnetic field controlled devices 20 are magnetic tunnel junction devices. The reconfigurable semiconductor logic device 100 may further include other devices as necessary.

The magnetic field controlled devices 20 are respectively located on both sides of the semiconductor device 10. The pair of magnetic field controlled devices 20 are spaced apart from the semiconductor device 10. The pair of magnetic field controlled devices 20 generate a magnetic field to control the semiconductor device 10. That is, magnetic field leakage generated from the pair of magnetic field controlled devices 20 can operate the semiconductor device 10. The semiconductor device 10 and the pair of magnetic field controlled devices 20 can be manufactured on a substrate 40 using a semiconductor manufacturing process. A process for manufacturing the semiconductor device 10 and the pair of magnetic field controlled devices 20 is easily understood by those skilled in the art, and thus a detailed description thereof is omitted.

Figure 2:
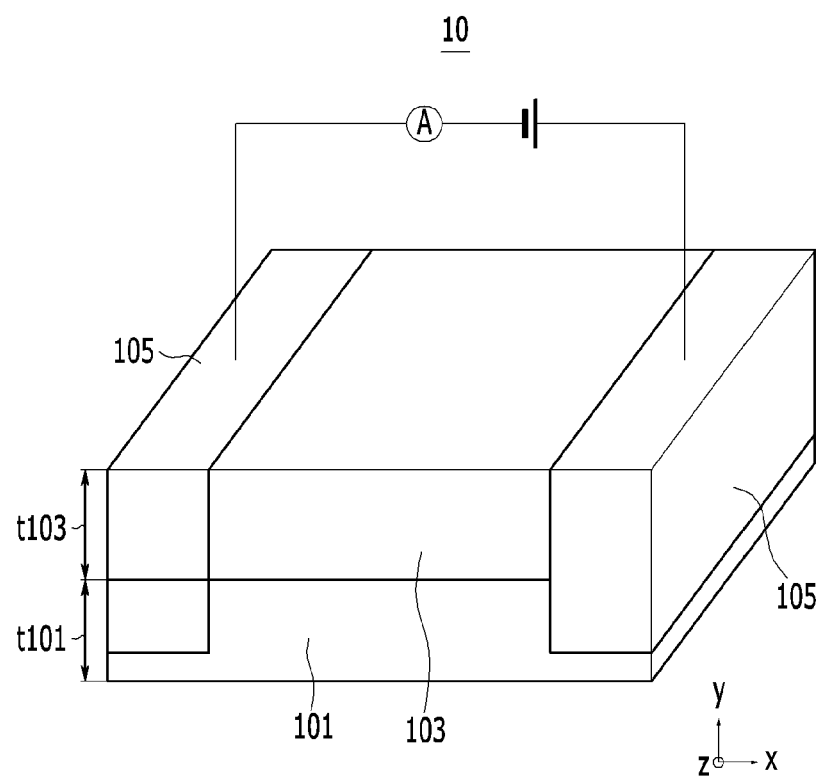
FIG. 2 is a schematic perspective view of a semiconductor device included in the reconfigurable semiconductor logic device shown in FIG. 1.

FIG. 2 is a schematic perspective view of the semiconductor device 10 included in the reconfigurable semiconductor logic device 100 shown in FIG. 1. The structure of the semiconductor device 10 of FIG. 2 is merely to exemplify the present invention, and the present invention is not limited thereto. Accordingly, the structure of the semiconductor device 10 can be formed in various manners.

The semiconductor device 10 shown in FIG. 2 can be manufactured using various etching methods including photolithography. Photolithography is easily understood by those skilled in the art, and thus a detailed description thereof is omitted.

As shown in FIG. 2, the semiconductor device 10 includes a first semiconductor layer 101 and a second semiconductor layer 103. Electrodes 105 are located on the second semiconductor layer 103 to connect the semiconductor device 10 to an external power source or current meter. A channel is formed between the electrodes 105.

The second semiconductor layer 103 is located on the first semiconductor layer 101 while coming into contact with the first semiconductor layer 101. Here, the first semiconductor layer 101 may be a p-type semiconductor layer, whereas the second semiconductor layer 103 may be an n-type semiconductor layer. Otherwise, the first semiconductor layer 101 may be an n-type semiconductor layer, whereas the second semiconductor layer 103 may be a p-type semiconductor layer. The first semiconductor layer 101 and the second semiconductor layer 103 may include InSb. The thickness of the first semiconductor layer 101 corresponding to an n-type semiconductor may be in the range of 0.1 μm to 10 μm without being related to a position. When the thickness t101 of the first semiconductor layer 101 is excessively small, channel resistance abruptly increases because charge mobility is excessively low. The thickness t103 of the second semiconductor layer 103 corresponding to a p-type semiconductor is less than 10 μm. When the thickness t103 of the second semiconductor layer 103 is excessively large, a very high magnetic field is necessary to operate the semiconductor device. Particularly, even when the semiconductor device 10 does not include the second semiconductor layer 103 corresponding to a p-type semiconductor, the first semiconductor layer 101 can function as a p-type semiconductor due to defects generated at the interface of the first semiconductor layer 101 corresponding to an n-type semiconductor. Accordingly, the thickness t101 of the first semiconductor device 101 is controlled to be in the above-described range.

Referring back to FIG. 1, the pair of magnetic field controlled devices 20 include a first magnetic field controlled device 201 and a second magnetic field controlled device 203. Each of the first magnetic field controlled device 201 and the second magnetic field controlled device 203 includes a first magnetic layer 205, a non-magnetic layer 207, and a second magnetic layer 209, respectively. Here, the first magnetic layer 205 has a fixed magnetization direction. On the contrary, the second magnetic layer 209 has a reversible magnetization direction. Accordingly, the magnetization direction of the second magnetic layer 209 can be changed by a current injection direction according to spin transfer torque.

That is, the magnetization direction of the first magnetic layer 205 can be controlled to be parallel with the magnetization direction of the second magnetic layer 209 by injecting spin-polarized current through the first magnetic layer 205, the non-magnetic layer 207, and the second magnetic layer 209. On the contrary, the magnetization direction of the first magnetic layer 205 can be controlled to be aligned antiparallel with the magnetization direction of the second magnetic layer 209 by injecting spin-polarized current through the second magnetic layer 209, the non-magnetic layer 207, and the first magnetic layer 205. Accordingly, it is possible to control the direction of a magnetic field leakage generated from the first magnetic field controlled device 201 and the second magnetic field controlled device 203 to a positive direction or a negative direction. As a result, the operation of the semiconductor device 10 is controlled using the magnetic field leakage. A method for controlling the operation of the semiconductor device 10 by using the magnetic field leakage is described in detail below.

When a specific magnetic field is applied to the semiconductor device 10, current flowing through the semiconductor device 10 abruptly increases according to the intensity and direction of the applied magnetic field. In this case, the intensity of the applied magnetic field sensitively varies with a voltage level applied to the semiconductor device 10. This characteristic of a current is similar to the characteristic of a p-n junction diode if the magnetic field is replaced by a voltage. The p-n junction diode has a given on-set voltage called a knee voltage, whereas the semiconductor device 10 has an on-set magnetic field varying according to a voltage applied thereto. Here, if an output current is at a high state, for example, a current of 100 mA can be defined as an ON state. On the contrary, if an output current is at a low state, for example, a current of 20 to 40 mA can be defined as an OFF state.

Electrons are generated by impact ionization of the semiconductor device 10 (shown in FIG. 2) and holes and electrons are recombined according to a magnetic field application direction. Electrical conductivity of the semiconductor device 10 (shown in FIG. 2) is determined based on generation of electrons due to impact ionization and hole-electron recombination according to the direction of the applied magnetic field. When a magnetic field is applied along a negative z-axis direction in FIG. 1 by the pair of magnetic field controlled devices 20, an amount of carrier electrons moving from the second semiconductor layer 103 to the first semiconductor layer 101 increases due to Lorentz force. When an amount of carrier electrons moving by Lorentz forces increases, an amount of carrier electrons at the interface of the first semiconductor layer and the second semiconductor layer decreases due to hole-electron recombination, and thus current decreases. On the contrary, when a magnetic field is applied along a positive z-axis direction, carrier electrons moving from the second semiconductor layer 103 to the first semiconductor layer 101 in FIG. 1 are depleted. That is, the amount of carrier electrons based on the direction of the applied magnetic field is not changed because Lorentz force is uniformly applied to the semiconductor device 10.

Figure 3:
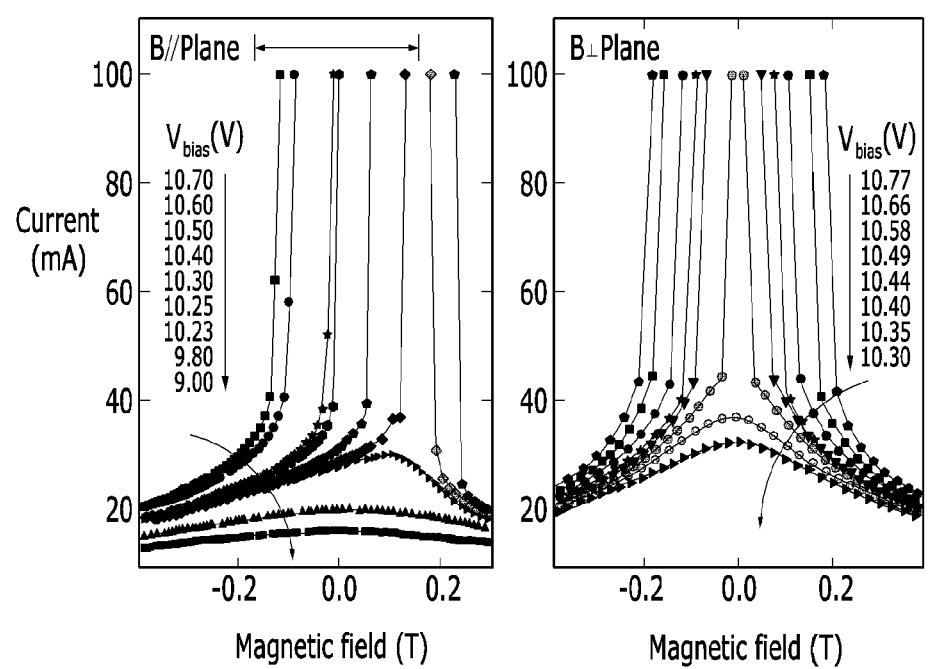
FIG. 3 is a graph schematically showing a magnitude of a magnetic field applied to the semiconductor device of FIG. 2 and a magnetic field application direction.

FIG. 3 is a schematic graph showing a magnitude of a magnetic field applied to the semiconductor device 10 of FIG. 2 and the direction of the applied magnetic field. The left graph of FIG. 3 shows a case in which a magnetic field is applied in a direction (z-axis direction of FIG. 1) parallel with the surface of the semiconductor device 10, while the right graph of FIG. 3 shows a case in which a magnetic field is applied in a direction (y-axis direction of FIG. 1) perpendicular to the surface of the semiconductor device 10. Here, the surface means a plane of the semiconductor device 10, which is parallel with the zx plane of FIG. 2.

Generally, when a magnetic field is applied in a direction perpendicular to the surface of the semiconductor device 10 (shown in FIG. 2), the amount of carrier electrons is not changed according to the direction of the magnetic field, as shown in the right graph of FIG. 3. Accordingly, a threshold magnetic field is observed to be symmetrical to the direction of the applied magnetic field. On the contrary, when a magnetic field is applied in a direction parallel with the surface of the semiconductor device 10 (shown in FIG. 2), a magnitude of a threshold magnetic field representing a high-density current state varies asymmetrically according to the direction of the applied magnetic field, as shown in the left graph of FIG. 3. Accordingly, it is possible to manufacture a logic device operating at room temperature using the phenomenon that a high current density on-set magnetic field applied to the semiconductor device 10 depends on a voltage applied to the semiconductor device 10. A description will be given of logic devices according to various exemplary embodiments.

Figure 4:
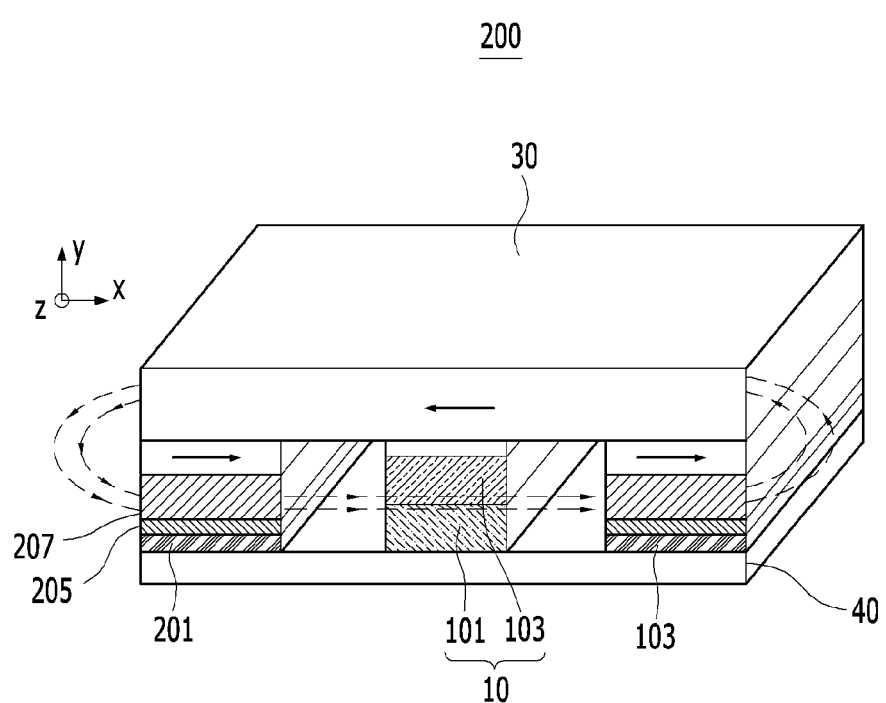
FIG. 4 schematically illustrates a reconfigurable semiconductor logic device according to a second exemplary embodiment of the present invention.

FIG. 4 illustrates a reconfigurable semiconductor logic device 200 according to a second exemplary embodiment of the present invention. Since the structure of the reconfigurable semiconductor logic device 200 shown in FIG. 4 is similar to the structure of the reconfigurable semiconductor logic device 100 shown in FIG. 1, like numbers refer to like elements throughout the description of FIGS. 1 and 4 and detailed descriptions thereof are omitted.

Referring to FIG. 4, the reconfigurable semiconductor logic device 200 includes a shielding structure 30. The shielding structure 30 is located on the semiconductor device 10 and the magnetic field controlled devices 20. Accordingly, the shielding structure 30 blocks magnetic field leakage generated from the magnetic field controlled devices 20 from leaking to the outside. As a result, it is possible to prevent malfunction of the reconfigurable semiconductor logic device 200 because a plurality of semiconductor devices 10 are not affected by a magnetic field therebetween even if the reconfigurable semiconductor logic device 200 is manufactured to have a complicated structure such as a three-dimensional structure. As a result, only a specific semiconductor device 10 can be addressed and selectively operated, and thus a highly integrated logic device 200 can be manufactured and prevented from malfunctioning. Furthermore, the shielding structures 30 are installed on the left and right sides of each of the magnetic field controlled devices 201 and 203 to block interference of magnetic field leakages generated from directly neighboring devices, thereby improving lateral integration of the logic device.

Figure 5:
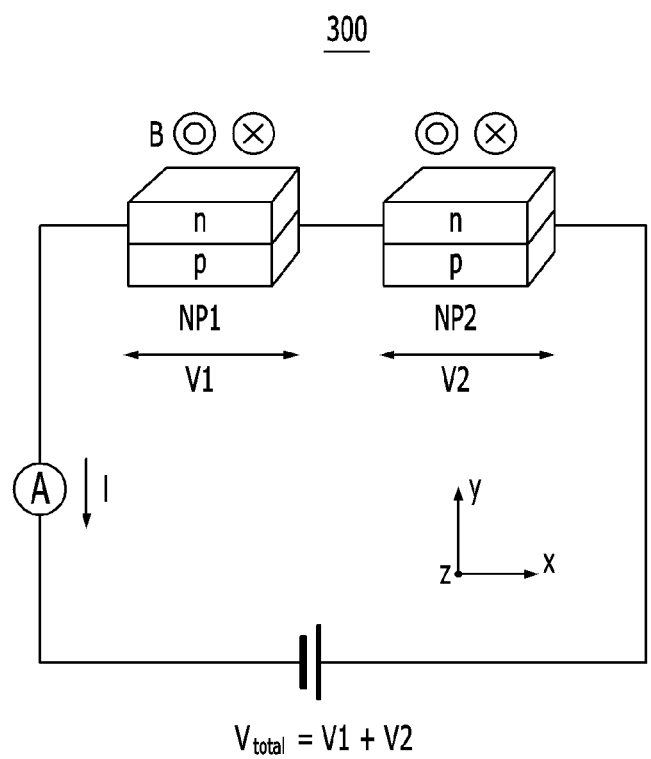
FIG. 5 schematically illustrates a reconfigurable semiconductor logic device according to a third exemplary embodiment of the present invention.

FIG. 5 illustrates a reconfigurable semiconductor logic device 300 according to a third exemplary embodiment of the present invention. The structure of the reconfigurable semiconductor logic device 300 shown in FIG. 5 is merely to illustrate the present invention, and the present invention is not limited thereto. Accordingly, the reconfigurable semiconductor logic device shown in FIG. 5 can be modified into a different form.

Meanwhile, two semiconductor devices 10 of FIG. 2 are serially connected to each other in FIG. 5. In FIG. 5, O and X represent a positive direction magnetic field and a negative direction magnetic field, respectively.

Referring to FIG. 5, the reconfigurable semiconductor logic device 300 includes two semiconductor devices NP1 and NP2. The semiconductor devices NP1 and NP2 have the same structure as that of the semiconductor device 10 shown in FIG. 2, in which an n-type semiconductor layer is located on a p-type semiconductor layer.

The pair of magnetic field controlled devices 20 (shown in FIG. 1) are respectively located on both sides of each of the semiconductor devices NP1 and NP2 in the z-axis direction, which is not show in FIG. 5 for convenience. Accordingly, the semiconductor devices NP1 and NP2 can be independently controlled by magnetic fields. Meanwhile, although not shown in FIG. 5, a shielding structure is located between the semiconductor devices NP1 and NP2. Accordingly, a magnetic field applied to each semiconductor device does not affect a neighboring semiconductor device, and thus a problem such as crosstalk is not generated.

As shown in FIG. 5, the two semiconductor devices NP1 and NP2 are serially connected to each other and a magnetic field is independently applied to each of the semiconductor devices NP1 and NP2. In this case, the semiconductor devices NP1 and NP2 conduct AND/OR behaviors corresponding to basic logical operations.

Figure 6:
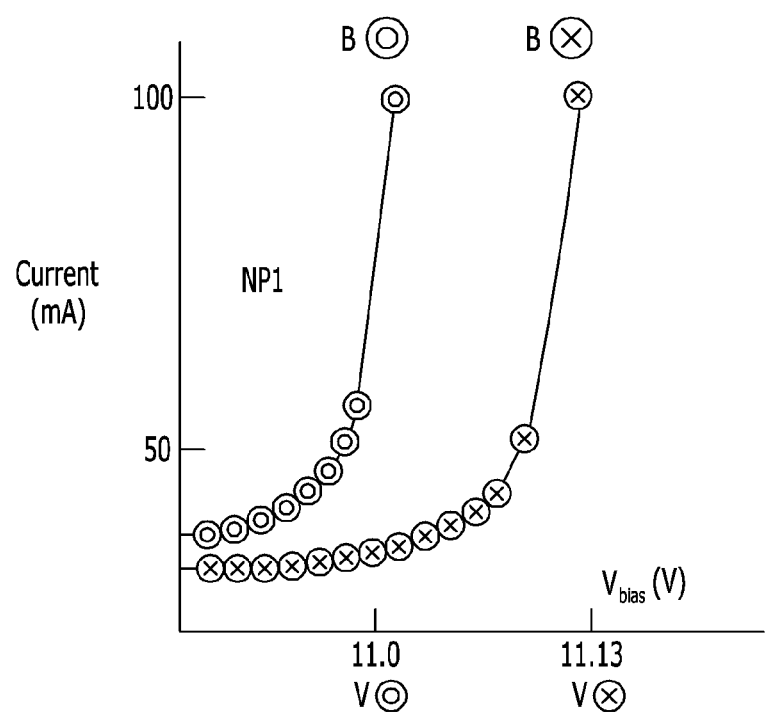
FIG. 6 is a graph showing current variations in semiconductor devices shown in FIG. 5 when a positive magnetic field and a negative magnetic field are applied thereto.

FIG. 6 is a graph showing current variations in the semiconductor devices NP1 and NP2 of FIG. 5 when a positive direction magnetic field and a negative direction magnetic field are applied to the semiconductor devices NP1 and NP2. The left curve of the graph of FIG. 6 shows a current variation in the semiconductor devices when the positive direction magnetic field is applied, and the right curve of the graph shows a current variation in the semiconductor devices when the negative direction magnetic field is applied. Here, V(o) denotes a threshold voltage when the positive direction magnetic field is applied, and V(x) denotes a threshold voltage when the negative magnetic field is applied.

As shown in the left curve of FIG. 6, current flowing through the semiconductor devices abruptly increases at a specific voltage or higher when the positive direction magnetic field is applied. That is, the current flowing through a semiconductor device can abruptly increase when a voltage higher than the threshold voltage of the semiconductor device is applied to the semiconductor device. In addition, as shown in the right curve of FIG. 6, the same phenomenon occurs when the negative direction magnetic field is applied to the semiconductor devices. Meanwhile, the threshold voltage of a semiconductor device when the negative direction magnetic field is applied to the semiconductor device is higher than the threshold voltage of the semiconductor device when the positive direction magnetic field is applied. It is possible to manufacture the reconfigurable semiconductor device by controlling the magnitude of a voltage applied to the semiconductor device and the direction of a magnetic field applied to the semiconductor device using the above-described phenomenon.

Returning to FIG. 5, current abruptly increases at the threshold voltages of the semiconductor devices NP1 and NP2 when a plane magnetic field is applied in a positive z-axis direction (positive direction) and a negative z-axis direction (negative direction). When a positive direction magnetic field and a negative direction magnetic field are applied to the semiconductor devices NP1 and NP2, the threshold voltages of the semiconductor devices NP1 and NP2 are varied according to the magnetic field direction. The threshold voltages in the negative direction magnetic field are higher than the threshold voltages in the positive direction magnetic field.

In addition, the same current flows through the semiconductor devices NP1 and NP2 when the plane magnetic field is applied thereto, and a high current state is observed only when a voltage applied to the semiconductor devices NP1 and NP2 is higher than the threshold voltages of the semiconductor devices NP1 and NP2. On the contrary, a low current state is observed when the voltage applied to the semiconductor devices NP1 and NP2 is lower than the threshold voltages of the semiconductor devices NP1 and NP2.

The voltage applied to the reconfigurable semiconductor logic device 300 is set to double an intermediate value of the threshold voltages of the semiconductor devices NP1 and NP2 in the positive direction magnetic field and the threshold voltages thereof in the negative direction magnetic field. Since the semiconductor devices NP1 and NP2 are serially connected to each other, the voltage corresponding to the intermediate value is applied to the semiconductor devices NP1 and NP2.

Accordingly, a higher voltage than the threshold voltages of the semiconductor devices NP1 and NP2 is applied to the semiconductor devices NP1 and NP2 only when the positive direction magnetic field is applied to the semiconductor devices NP1 and NP2, thereby increasing the amount of current flowing through the semiconductor devices NP1 and NP2. Therefore, a logical operation can be executed by alternately applying the positive direction magnetic field and the negative direction magnetic field to the semiconductor devices NP1 and NP2, which will be described below.

When the negative direction magnetic field is applied to both of the semiconductor devices NP1 and NP2, voltages V1 and V2 respectively applied to the semiconductor devices NP1 and NP2 are lower than the threshold voltages of the semiconductor devices NP1 and NP2, and thus the semiconductor devices NP1 and NP2 output a low current. This state can be defined as "0". Meanwhile, even when the positive direction magnetic field is applied to one of the semiconductor devices NP1 and NP2 and the negative direction magnetic field is applied to the other, the semiconductor devices NP1 and NP2 output a low current because the voltages V1 and V2 applied to the semiconductor devices NP1 and NP2 are lower than the threshold voltages of the semiconductor devices NP1 and NP2. Accordingly, this state can also be defined as "0". On the contrary, when the positive direction magnetic field is applied to both of the semiconductor devices NP1 and NP2, the semiconductor devices NP1 and NP2 output a high current because the voltages V1 and V2 applied to the semiconductor devices NP1 and NP2 are higher than the threshold voltages of the semiconductor devices NP1 and NP2. This state can be defined as "1". The above-described control method is shown in Table 1 and corresponds to an AND operation.

TABLE 1

| Logical input | | Logical output |
| --- | --- | --- |
| NP1 | NP2 | (current) |
| 0 (negative direction magnetic field) | 0 (negative direction magnetic field) | 0 (low) |
| 0 (negative direction magnetic field) | 1 (positive direction magnetic field) | 0 (low) |
| 1 (positive direction magnetic field) | 0 (negative direction magnetic field) | 0 (low) |
| 1 (positive direction magnetic field) | 1 (positive direction magnetic field) | 1 (high) |

Meanwhile, the voltage applied to the reconfigurable semiconductor logic device 300 can be set to be higher than double the intermediate value of the sum of the threshold voltage of each of the semiconductor devices NP1 and NP2 in the positive direction magnetic field and the threshold voltage thereof in the negative direction magnetic field, and lower than double the threshold voltage in the negative direction magnetic field. Accordingly, a logical operation can be performed by alternately applying the positive direction magnetic field and the negative direction magnetic field to the semiconductor devices NP1 and NP2, which will be described in detail below.

When the negative direction magnetic field is applied to both of the semiconductor devices NP1 and NP2, the semiconductor devices NP1 and NP2 output a low current because the voltages V1 and V2 applied to the semiconductor devices NP1 and NP2 are lower than the threshold voltages of the semiconductor devices NP1 and NP2. This state can be defined as "0". Meanwhile, when the positive direction magnetic field is applied to one of the semiconductor devices NP1 and NP2 and the negative direction magnetic field is applied to the other, the semiconductor devices NP1 and NP2 output a high current because the voltages V1 and V2 applied to the semiconductor devices NP1 and NP2 exceed the threshold voltages of the semiconductor devices NP1 and NP2 when the positive direction magnetic field is applied thereto. Accordingly, this state can be defined as "1". Meanwhile, when the positive direction magnetic field is applied to both of the semiconductor devices NP1 and NP2, the output current of each semiconductor device increases because the voltages V1 and V2 applied to the semiconductor devices NP1 and NP2 are higher than the threshold voltages of the semiconductor devices NP1 and NP2. This state can also be defined as "1".

The above-described control method is shown in Table 2 and corresponds to an OR operation.

TABLE 2

| Logical input | | Logical output |
| --- | --- | --- |
| NP1 | NP2 | (current) |
| 0 (negative direction magnetic field) | 0 (negative direction magnetic field) | 0 (low) |
| 0 (negative direction magnetic field) | 1 (positive direction magnetic field) | 1 (high) |
| 1 (positive direction magnetic field) | 0 (negative direction magnetic field) | 1 (high) |
| 1 (positive direction magnetic field) | 1 (positive direction magnetic field) | 1 (high) |

As described above, both of the AND operation and OR operation can be performed using the reconfigurable semiconductor logic device 300 shown in FIG. 5. Accordingly, the operation speed and integration of the reconfigurable semiconductor logic device 300 can be improved.

Figure 7:
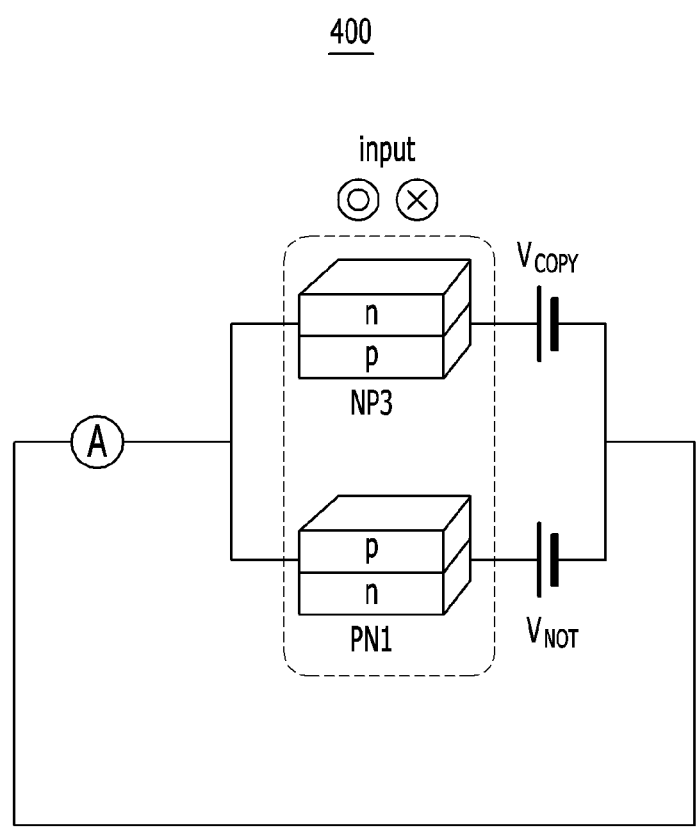
FIG. 7 schematically illustrates a reconfigurable semiconductor logic device according to a fourth exemplary embodiment of the present invention.

FIG. 7 schematically illustrates a reconfigurable semiconductor logic device 400 according to a fourth exemplary embodiment of the present invention. In FIG. 7, semiconductor devices NP3 and PN1 are coupled in a parallel manner to construct the reconfigurable semiconductor logic device 400. Since FIG. 7 is similar to FIG. 5, and thus like numbers refer to like elements, detailed descriptions thereof are omitted. Meanwhile, the structure of the reconfigurable semiconductor logic device 400 of FIG. 7 is merely to exemplify the present invention and the present invention is not limited thereto. Accordingly, the reconfigurable semiconductor logic device 400 of FIG. 7 can be modified into a different structure.

Magnetic field controlled devices are located in the z-axis direction of the two semiconductor devices, which is not shown in FIG. 7 for convenience. The semiconductor devices NP3 and PN1 can be controlled together with the magnetic field controlled devices. Accordingly, the semiconductor devices NP3 and PN1 are shown as a set denoted by a dotted line.

Referring to FIG. 7, the reconfigurable semiconductor logic device 400 includes the semiconductor devices NP3 and PN1. The semiconductor device NP3 has a structure in which an n-type semiconductor layer is located on a p-type semiconductor layer. On the contrary, the semiconductor device PN1 has a structure in which a p-type semiconductor layer is located on an n-type semiconductor layer. Accordingly, output current of the semiconductor device PN1 is opposite to that of the semiconductor device NP3 for a magnetic field direction.

The semiconductor devices NP3 and PN1 are respectively connected to power sources $V_{COPY}$ and $V_{NOT}$. Accordingly, voltages $V_{COPY}$ and $V_{NOT}$ of the power sources are respectively applied to the semiconductor devices NP3 and PN1.

If the voltage $V_{NOT}$ of the power source serially connected to the semiconductor device PN1 is 0, current does not flow through the semiconductor device PN1. Accordingly, the output current of the semiconductor device PN1 depends on the semiconductor device NP3 and the voltage $V_{COPY}$ of the power source connected thereto. When the positive direction magnetic field is applied to the semiconductor device NP3 and the voltage $V_{COPY}$ is higher than the threshold voltage of the semiconductor device NP3 in the positive direction magnetic field, the current increases. When the voltage $V_{COPY}$ of the power source is lower than the threshold voltage of the semiconductor device NP3 in the negative direction magnetic field even if the negative direction magnetic field is applied to the semiconductor device NP3, current flowing through the semiconductor device NP3 is low. Accordingly, the COPY operation can be performed by controlling the voltage $V_{COPY}$ of the power source to be higher than the threshold voltage of the semiconductor device NP3 in the positive direction magnetic field and lower than the threshold voltage thereof in the negative direction magnetic field. The above description is shown in Table 3. As shown in Table 3, the COPY operation can be performed because the same value as an input corresponding to a magnetic field direction is obtained as an output corresponding to the current.

TABLE 3

| Logical input NP3 | Logical output (current) |
| --- | --- |
| 0 (negative direction magnetic field) | 0 (low) |
| 1 (positive direction magnetic field) | 1 (high) |

Meanwhile, when the voltage $V_{COPY}$ of the power source serially connected to the semiconductor device NP3 is 0, current does not flow through the semiconductor device NP3. Accordingly, the output current of the semiconductor device NP3 depends on the semiconductor device PN1 and the voltage $V_{NOT}$ of the power source connected to the semiconductor device PN1. When the negative direction magnetic field is applied to the semiconductor device PN1 and the voltage $V_{NOT}$ of the power source is higher than the threshold voltage of the semiconductor device PN1 in the negative direction magnetic field, the current increases. In addition, when the voltage $V_{NOT}$ of the power source is lower than the threshold voltage of the semiconductor device PN1 in the positive direction magnetic field even if the positive direction magnetic field is applied to the semiconductor device PN1, current flowing through the semiconductor device PN1 is low. Accordingly, a NOT operation can be performed by controlling the voltage $V_{NOT}$ of the power source to be higher than the threshold voltage of the semiconductor device PN1 in the negative direction magnetic field and lower than the threshold voltage thereof in the positive direction magnetic field. This is shown in Table 4. As shown in Table 4, a value opposite to an input corresponding to a magnetic field direction is obtained as an output corresponding to the current.

TABLE 4

| Logical input PN1 | Logical output (current) |
| --- | --- |
| 0 (negative direction magnetic field) | 1 (high) |
| 1 (positive direction magnetic field) | 0 (low) |

As described above, both of the COPY operation and the NOT operation can be performed using the reconfigurable semiconductor logic device 400 of FIG. 7. Accordingly, the operation speed and integration of the reconfigurable semiconductor logic device 400 can be improved.

Figure 8:
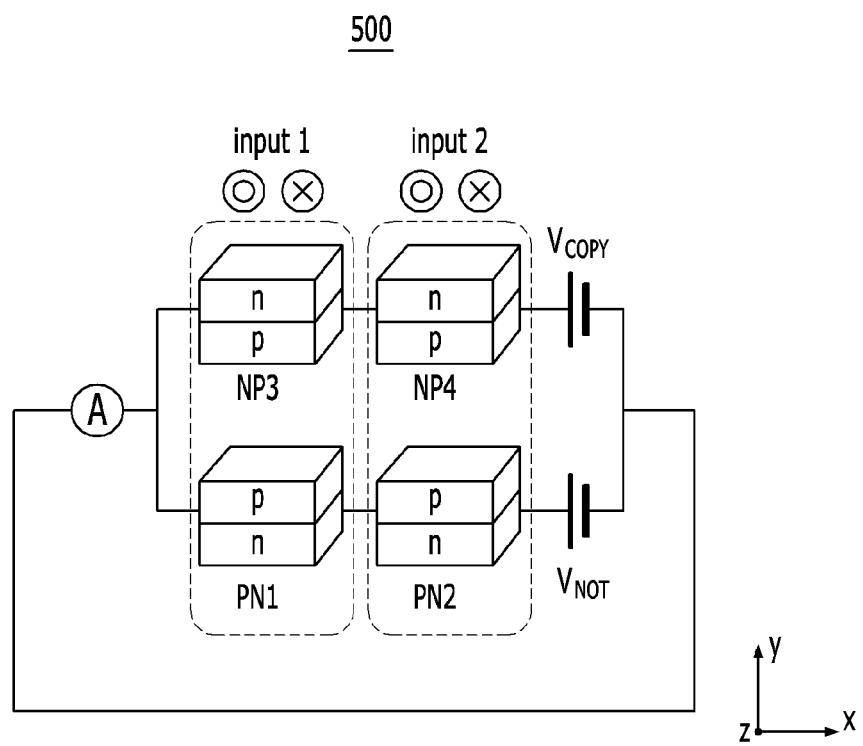
FIG. 8 schematically illustrates a reconfigurable semiconductor logic device according to a fifth exemplary embodiment of the present invention.

FIG. 8 schematically illustrates a reconfigurable semiconductor logic device 500 according to a fifth exemplary embodiment of the present invention. Referring to FIG. 8, the reconfigurable semiconductor logic device 500 is constructed by connecting a pair of the same semiconductor devices NP3 and NP4 with a pair of the same semiconductor devices PN1 and PN2 in a parallel manner.

Meanwhile, since FIG. 8 is similar to FIG. 7, like numbers refer to like elements and detailed descriptions thereof is omitted. The structure of the reconfigurable semiconductor logic device 500 of FIG. 8 is merely to exemplify the present invention, and the present invention is not limited thereto. Accordingly, the reconfigurable semiconductor logic device 500 of FIG. 8 can be modified into different structures.

As shown in FIG. 8, the reconfigurable semiconductor logic device 500 is constructed using the four semiconductor devices NP3, NP4, PN1, and PN2. A magnetic field is applied to the semiconductor devices NP3 and PN1 in the same direction and a magnetic field is applied to the semiconductor devices NP4 and PN2 in the same direction as well. However, the magnetic field applied to the semiconductor devices NP3 and PN1 and the magnetic field applied to the semiconductor devices NP4 and PN2 are independent of each other. Accordingly, the semiconductor devices NP3 and PN1 and the semiconductor devices NP4 and PN2 are shown as different sets denoted by dotted lines to be discriminated from each other in FIG. 8.

As shown in FIG. 8, the semiconductor devices NP3 and NP4 have a structure in which an n-type semiconductor is located on a p-type semiconductor and the semiconductor devices PN1 and PN2 have a structure in which a p-type semiconductor is located on an n-type semiconductor. Accordingly, the semiconductor devices NP3 and NP4 and the semiconductor devices PN1 and PN2 have stack structures opposite to each other.

A pair of magnetic field controlled devices may be located on both sides of the semiconductor devices NP3 and PN1 and a magnetic field generated from the pair of magnetic field controlled devices may be applied to the semiconductor devices NP3 and PN1, which is not shown FIG. 8 for convenience. Furthermore, another pair of magnetic field controlled devices may be located on both sides of the semiconductor devices NP4 and PN2 to apply the same magnetic field to the semiconductor devices NP4 and PN2. Meanwhile, a shielding structure (not shown in FIG. 8) is located between the semiconductor devices NP3 and PN1 and the semiconductor devices NP4 and PN2. Accordingly, the magnetic field applied to each semiconductor device does not affect a neighboring semiconductor device, and thus a problem such as crosstalk is not generated.

AND, OR, NOR, and NAND operations can be performed using the reconfigurable semiconductor logic device 500 of FIG. 8. AND, OR, NOR, and NAND operation methods described below are merely to exemplify the present invention and the present invention is not limited thereto.

To perform the AND operation, the voltage $V_{NOT}$ of the power source is not applied, and only the voltage $V_{COPY}$ thereof is applied. In this case, while the voltage $V_{NOT}$ of the power source and the semiconductor devices PN1 and PN2 do not entirely affect the amount of current, only the voltage $V_{COPY}$ and the semiconductor devices NP3 and NP4 affect the amount of current. This state is similar to the AND operation of the reconfigurable semiconductor logic device 300 of FIG. 5, and thus an AND operation similar to that of the reconfigurable semiconductor logic device 300 of FIG. 5 can be performed.

In addition, in order to perform an OR operation, the voltage $V_{NOT}$ of the power source is not applied and a voltage higher than that for the above AND operation is applied as the voltage $V_{COPY}$. In this case, the voltage $V_{NOT}$ and the semiconductor devices PN1 and PN2 do not affect the amount of current, only the voltage $V_{COPY}$ of the power source and the semiconductor devices NP3 and NP4 affect the amount of current. This state is similar to the OR operation of the reconfigurable semiconductor logic device 300 of FIG. 5, and thus an OR operation similar to that of the reconfigurable semiconductor logic device 300 of FIG. 5 can be performed.

Meanwhile, in order to perform a NOR operation, the voltage $V_{COPY}$ of the power source is not applied and only the voltage $V_{NOT}$ thereof is applied. In this case, the voltage $V_{COPY}$ of the power source and the semiconductor devices NP3 and NP4 do not affect the amount of current, only the voltage $V_{NOT}$ and the semiconductor devices PN1 and PN2 affect the amount of current. In addition, since the semiconductor devices NP3 and NP4 have different operation characteristics from those of the semiconductor devices PN1 and PN2 due to a structural difference therebetween, the current remarkably increases when the negative direction magnetic field is applied. Accordingly, after supplying the specific voltage $V_{NOT}$, the current remarkably increases only when the negative direction magnetic field is applied to both of the semiconductor devices PN1 and PN2, and the current does not considerably increase when the negative direction magnetic field is applied to only one of the semiconductor devices PN1 and PN2 or the positive direction magnetic field is applied to both of the semiconductor devices PN1 and PN2. As a result, the NOR operation can be performed and is shown in Table 5.

TABLE 5

| Logical input | | Logical output |
|---|---|---|
| PN1 | PN2 | (current) |
| 0 (negative direction magnetic field) | 0 (negative direction magnetic field) | 1 (high) |
| 0 (negative direction magnetic field) | 1 (positive direction magnetic field) | 0 (low) |
| 1 (positive direction magnetic field) | 0 (negative direction magnetic field) | 0 (low) |
| 1 (positive direction magnetic field) | 1 (positive direction magnetic field) | 0 (low) |

Meanwhile, in order to perform a NAND operation, the voltage $V_{COPY}$ of the power source is not applied and only the voltage $V_{NOT}$ of the power source can be applied. In this case, the voltage $V_{COPY}$ of the power source and the semiconductor devices NP3 and NP4 do not affect the amount of current, but only the voltage $V_{NOT}$ of the power source and the semiconductor devices PN1 and PN2 affect the amount of current. The current of the semiconductor devices NP3 and NP4 remarkably increases when the negative direction magnetic field is applied thereto. Accordingly, the current remarkably increases only when the negative direction magnetic field is applied to one of the semiconductor devices PN1 and PN2 after supplying the specific voltage $V_{NOT}$. On the contrary, the current does not considerably increase when the positive direction magnetic field is applied to both of the semiconductor devices PN1 and PN2. As a result, the NAND operation can be performed and is shown in Table 6.

TABLE 6

| Logical input | | Logical output |
|---|---|---|
| PN1 | PN2 | (current) |
| 0 (negative direction magnetic field) | 0 (negative direction magnetic field) | 1 (high) |
| 0 (negative direction magnetic field) | 1 (positive direction magnetic field) | 1 (high) |
| 1 (positive direction magnetic field) | 0 (negative direction magnetic field) | 1 (high) |
| 1 (positive direction magnetic field) | 1 (positive direction magnetic field) | 0 (low) |

As described above, various logical operations can be implemented by controlling only the applied voltage and magnetic field direction. That is, semiconductor devices having the same layout can be used for various operations, and thus not only device integration but also operation speed can be remarkably increased.

The present invention will be explained in detail through experimental examples below. The experimental examples simply exemplify the present invention and the present invention is not limited thereto.

EXPERIMENTAL EXAMPLE

Experiment on Logic Device for AND Operation

A reconfigurable semiconductor logic device having the same structure as the reconfigurable semiconductor logic device of FIG. 5 was manufactured. Here, a semiconductor device having a channel width of 10 μm and a length of 120 μm was manufactured using photolithography. Meanwhile, the semiconductor device was manufactured by laminating an n-type InSb layer having a thickness of 0.2 μm on a p-type InSb layer having a thickness of 6 μm. A method for manufacturing a magnetic field controlled device can be easily understood by those skilled in the art, and thus a detailed description thereof is omitted.

The threshold voltages of the semiconductor devices NP1 and NP2 were 11.0 V when a positive direction magnetic field was applied thereto, and 11.3 V when a negative direction magnetic field was applied thereto. The positive or negative direction magnetic field was applied to the semiconductor devices NP1 and NP2 while applying a voltage of 22.05 V thereto to observe current variations in the semiconductor devices. Here, the voltage of 22.05 V is a value that is smaller than double an intermediate value of the threshold voltages when the positive/negative direction magnetic fields was applied, and smaller than double the threshold voltages when the negative direction magnetic filed was applied. The current variations are shown in Table 7.

TABLE 7

| Logical input | | Logical output |
|---|---|---|
| NP1 | NP2 | (current) |
| 0 (negative direction magnetic field) | 0 (negative direction magnetic field) | 0 (34 mA) |
| 0 (negative direction magnetic field) | 1 (positive direction magnetic field) | 0 (41 mA) |
| 1 (positive direction magnetic field) | 0 (negative direction magnetic field) | 0 (41 mA) |
| 1 (positive direction magnetic field) | 1 (positive direction magnetic field) | 1 (>100 mA) |

As shown in Table 7, the current was remarkably increased when the positive direction magnetic field was applied to both of the semiconductor devices NP1 and NP2. Meanwhile, the current flowing through the semiconductor devices NP1 and NP2 was low when the negative direction magnetic field was applied to one of the semiconductor devices NP1 and NP2.

Figure 9:
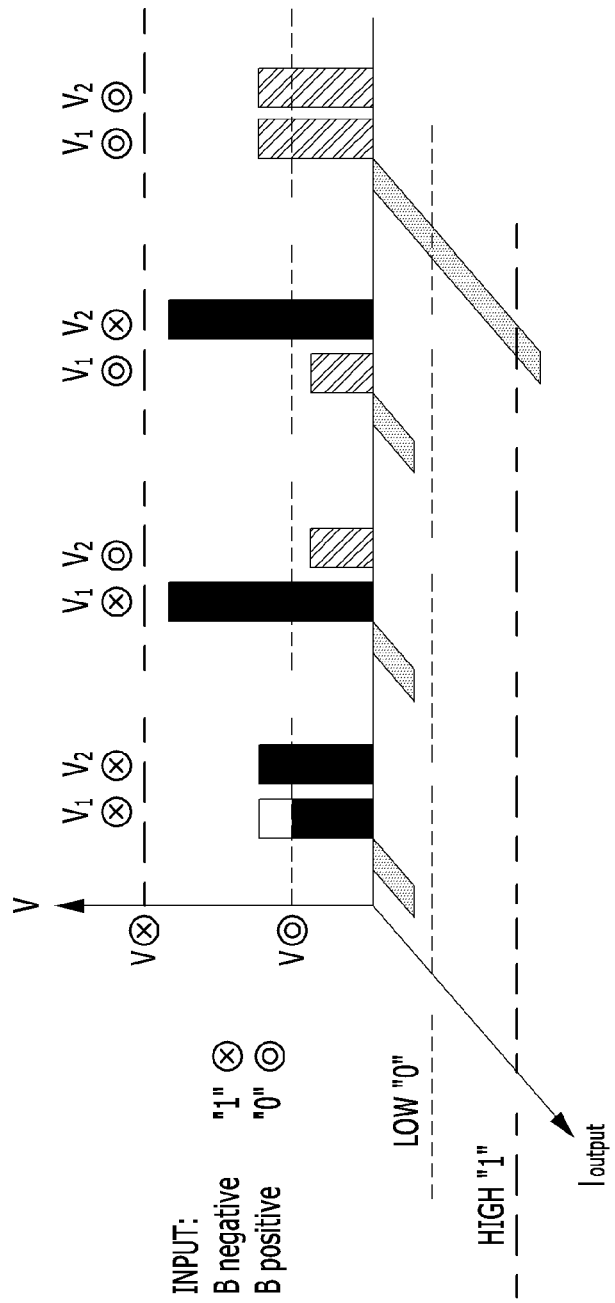
FIG. 9 and FIG. 10 are graphs showing voltage and current variations in each semiconductor device according to operation of the logic device shown in FIG. 5.

FIG. 9 is a graph showing voltage and current variations in each semiconductor device according to operation of the AND logic device of FIG. 5. In FIG. 9, a black bar represents a voltage drop caused by input of the negative direction magnetic field (x), a hatched bar represents a voltage drop caused by input of the positive direction magnetic field (o), and a dotted bar represents current caused by the positive/negative direction magnetic fields. In addition, V(o) and V(x) respectively represent threshold voltages in the positive and negative direction magnetic fields.

As shown in FIG. 9, while output current was low when the negative direction magnetic field was applied to both of the semiconductor devices NP1 and NP2 or the negative/positive direction magnetic fields were applied thereto, the output current was high when the positive direction magnetic field was applied to both of the semiconductor devices NP1 and NP2. Accordingly, it was possible to configure a logic device capable of executing an AND operation by applying a voltage similar to the sum of the threshold voltages of the semiconductor devices NP1 and NP2 to the semiconductor devices NP1 and NP2, as described above.

Experiment on Logic Device for OR Operation

A logic device having the same structure as the reconfigurable semiconductor logic device of FIG. 5 was manufactured. The threshold voltages of the semiconductor devices NP1 and NP2 were 11.0 V when the negative direction magnetic field was applied thereto and 11.13 V when the positive direction magnetic field was applied thereto. The positive or negative direction magnetic field was applied to the semiconductor devices NP1 and NP2 while supplying a voltage of 22.20 V thereto to observe current variations in the semiconductor devices. Here, the voltage of 22.20 V is a value that is larger than the sum of the threshold voltages when the positive/negative direction magnetic fields were applied, and smaller than double the threshold voltages when the negative direction magnetic filed was applied. The current variations are shown in Table 8.

TABLE 8

| Logical input | | Logical output |
|---|---|---|
| NP1 | NP2 | (current) |
| 0 (negative direction magnetic field) | 0 (negative direction magnetic field) | 0 (38 mA) |
| 0 (negative direction magnetic field) | 1 (positive direction magnetic field) | 1 (>100 mA) |
| 1 (positive direction magnetic field) | 0 (negative direction magnetic field) | 1 (>100 mA) |
| 1 (positive direction magnetic field) | 1 (positive direction magnetic field) | 1 (>100 mA) |

As shown in Table 8, the current was remarkably increased when the positive direction magnetic field was applied to one of the semiconductor devices NP1 and NP2. However, the current flowing through the semiconductor devices NP1 and NP2 was very low when the negative direction magnetic field was applied to both of the semiconductor devices NP1 and NP2.

Figure 10:
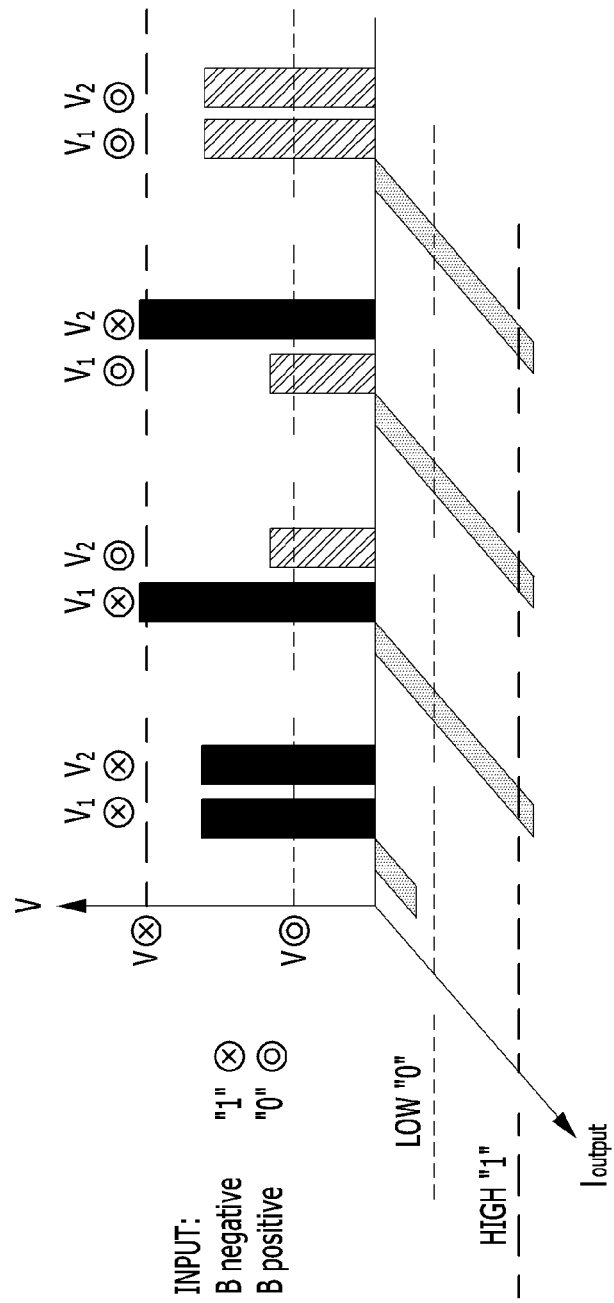

FIG. 10 is a graph showing voltage and current variations in each semiconductor device according to operation of the OR logic device of FIG. 5. The graph of FIG. 10 is similar to the graph of FIG. 9, so like reference numerals refer to like elements and only differences between the graphs are described below.

As shown in FIG. 10, while output current was low when the negative direction magnetic field was applied to both of the semiconductor devices NP1 and NP2, the output current was high when the positive direction magnetic field was applied to one of the semiconductor devices NP1 and NP2. Accordingly, as described above, it was possible to configure a logic device capable of executing the OR operation by applying a voltage that is higher than the sum of the threshold voltages of the semiconductor devices NP1 and NP2 in the positive/negative direction magnetic fields and lower than double the threshold voltages in the negative direction magnetic field.

As described above, it was possible to perform the AND operation and the OR operation using the reconfigurable semiconductor logic device of FIG. 5. Accordingly, it was possible to manufacture the reconfigurable semiconductor logic device capable of executing two operations, thereby remarkably improving the integration and operation speed thereof.

Experiment on Logic Device for COPY Operation

A logic device capable of generating an output signal identical to an input signal was manufactured. That is, a reconfigurable semiconductor logic device having the same structure as the reconfigurable semiconductor logic device shown in FIG. 7 was manufactured. In this case, the threshold voltage of the semiconductor device NP3 was 10.35 V and the threshold voltage of the semiconductor device PN1 was 12.4 V when the positive direction magnetic field was applied. The threshold voltage of the semiconductor device NP3 was 10.47 V and the threshold voltage of the semiconductor device PN1 was 12.0 V when the negative direction magnetic field was applied. 0 V was applied as the voltage $V_{NOT}$ and 10.42 V was applied as the voltage $V_{COPY}$. The voltage $V_{COPY}$ was higher than the threshold voltage of the semiconductor device NP3 when the positive direction magnetic field was applied thereto and lower than the threshold voltage of the semiconductor device NP3 when the negative direction magnetic field was applied thereto. Current is measured by applying the negative direction magnetic field and the positive direction magnetic field to the semiconductor device NP3 after a voltage of 10.42 V is supplied as the voltage $V_{COPY}$ of the power source, and a result is shown in Table 9.

TABLE 9

| Logical input NP3 | Logical output (current) |
|---|---|
| 0 (negative direction magnetic field) | 0 (17.5 mA) |
| 1 (positive direction magnetic field) | 1 (>100 mA) |

As shown in Table 9, it was confirmed that output current was low because the voltage $V_{COPY}$ of the power source was lower than the threshold voltage of the semiconductor device NP3 when the negative direction magnetic field was applied thereto. Accordingly, it was possible to perform an operation capable of generating an output identical to an input by applying a voltage that is lower than the threshold voltage of the semiconductor device NP3 when the negative direction magnetic field is applied thereto and higher than the threshold voltage when the positive direction magnetic field is applied thereto.

Experiment on Logic Device for NOT Operation

A logic device capable of generating an output signal opposite to an input signal was manufactured. That is, a reconfigurable semiconductor logic device having the same structure as the reconfigurable semiconductor logic device shown in FIG. 7 was manufactured. The reconfigurable semiconductor logic device of FIG. 7 is the same as the above-described logic device for COPY operation described above, so a detailed description thereof is omitted.

0 V was applied as the voltage $V_{COPY}$ of the power source and 12.1 V was applied as the voltage $V_{NOT}$ thereof. The voltage $V_{NOT}$ was higher than the threshold voltage of the semiconductor device PN1 when the negative direction magnetic field was applied thereto and lower than the threshold voltage of the semiconductor device PN1 when the positive direction magnetic field was applied thereto. Current is measured by applying the negative direction magnetic field and the positive direction magnetic field to the semiconductor device PN1 after a voltage of 12.1 V is supplied as the voltage $V_{NOT}$ of the power source, and a result is shown in Table 10.

TABLE 10

| Logical input<br>PN1 | Logical output<br>(current) |
|---|---|
| 0 (negative direction magnetic field) | 1 (>100 mA) |
| 1 (positive direction magnetic field) | 0 (35 mA) |

As shown in Table 10, it was confirmed that the current was increased because the voltage $V_{NOT}$ of the power source was higher than the threshold voltage of the semiconductor device PN1 in the negative direction magnetic field when the negative direction magnetic field was applied to the semiconductor device PN1. Accordingly, it was possible to implement a logic device generating an output opposite to an input by applying a voltage higher than the threshold voltage of the semiconductor device PN1 when the negative direction magnetic field is applied thereto and lower than the threshold voltage when the positive direction magnetic field is applied thereto.

Experiment on Logic Device for AND/OR/NOR/NAND Operations

A reconfigurable semiconductor logic device having the same structure as that shown in FIG. 8 was manufactured. In this case, the threshold voltages of the semiconductor devices NP3, NP4, PN1, and PN2 were 10.35 V, 10.11 V, 12.4 V, and 12.8 V, respectively, in the positive direction magnetic field, and 10.47 V, 10.23 V, 12.0 V, and 12.65 V, respectively, in the negative direction magnetic field.

0 V was applied as the voltage $V_{NOT}$ of the power source and 20.50 V was applied as the voltage $V_{COPY}$ of the power source in FIG. 8. The voltage $V_{COPY}$ of the power source was similar to the intermediate value of the sum of the threshold voltages of the semiconductor devices NP3 and NP4 in the positive direction magnetic field and the sum of the threshold voltages in the negative direction magnetic field, and thus the reconfigurable semiconductor logic device performed the same as the AND operation of the logic device 300 shown in FIG. 5. The operation result is shown in Table 11.

TABLE 11

| Logical input | | Logical output |
|---|---|---|
| NP3 | NP4 | (current) |
| 0 (negative direction magnetic field) | 0 (negative direction magnetic field) | 0 (22.5 mA) |
| 0 (negative direction magnetic field) | 1 (positive direction magnetic field) | 0 (24.3 mA) |
| 1 (positive direction magnetic field) | 0 (negative direction magnetic field) | 0 (26.6 mA) |
| 1 (positive direction magnetic field) | 1 (positive direction magnetic field) | 1 (>100 mA) |

Meanwhile, 0 V was applied as the voltage $V_{NOT}$ and 20.64 V was applied as the voltage $V_{COPY}$ in FIG. 8. The voltage $V_{COPY}$ of the power source was higher than the intermediate value of the sum of the threshold voltages of the semiconductor devices NP3 and NP4 in the positive direction magnetic field and the sum of the threshold voltages in the negative direction magnetic field and lower than double the threshold voltages in the negative direction magnetic field, and thus the reconfigurable semiconductor logic device performed the same as the OR operation of the logic device 300 shown in FIG. 5. The operation result is shown in Table 12.

TABLE 12

| Logical input | | Logical output |
|---|---|---|
| NP3 | NP4 | (current) |
| 0 (negative direction magnetic field) | 0 (negative direction magnetic field) | 0 (25.5 mA) |
| 0 (negative direction magnetic field) | 1 (positive direction magnetic field) | 1 (>100 mA) |
| 1 (positive direction magnetic field) | 0 (negative direction magnetic field) | 1 (>100 mA) |
| 1 (positive direction magnetic field) | 1 (positive direction magnetic field) | 1 (>100 mA) |

In addition, 0 V was applied as the voltage $V_{COPY}$ of the power source and 24.7 V was applied as the voltage $V_{NOT}$ thereof in FIG. 8. The voltage $V_{NOT}$ was higher than the sum of the threshold voltages of the semiconductor devices PN1 and PN2 in the negative direction magnetic field and lower than the sum of the threshold voltages in the positive direction magnetic field. The current was high only when the negative direction magnetic field was applied to both of the semiconductor devices PN1 and PN2, and the current was low when the positive direction magnetic field was applied to at least one of the semiconductor devices PN1 and PN2. As a result, the result of the NOR operation as shown in Table 13 was obtained. Accordingly, it was confirmed that the NOR operation can be performed using the reconfigurable semiconductor logic device of FIG. 8.

TABLE 13

| Logical input | | Logical output |
|---|---|---|
| PN1 | PN2 | (current) |
| 0 (negative direction magnetic field) | 0 (negative direction magnetic field) | 1 (>100 mA) |
| 0 (negative direction magnetic field) | 1 (positive direction magnetic field) | 0 (38.2 mA) |
| 1 (positive direction magnetic field) | 0 (negative direction magnetic field) | 0 (36.0 mA) |
| 1 (positive direction magnetic field) | 1 (positive direction magnetic field) | 0 (30.1 mA) |

In addition, 0 V was applied as the voltage $V_{COPY}$ of the power source and 25.1 V was applied as the voltage $V_{NOT}$ of the power source in FIG. 8. The voltage $V_{NOT}$ was set to higher than the intermediate value of the sum of the threshold voltages of the semiconductor devices PN1 and PN2 in the negative direction magnetic field and the sum of the threshold voltages in the positive direction magnetic field. In this case, the current was high only when the positive direction magnetic field was applied to both of the semiconductor devices PN1 and PN2, and the current was low when the negative direction magnetic field was applied to at least one of the semiconductor devices PN1 and PN2. As a result, the result of the NAND operation as shown in Table 14 was obtained. Accordingly, it was confirmed that the NAND operation can be performed using the reconfigurable semiconductor logic device of FIG. 8.

TABLE 14

| Logical input | | Logical output |
|---|---|---|
| PN1 | PN2 | (current) |
| 0 (negative direction magnetic field) | 0 (negative direction magnetic field) | 1 (>100 mA) |
| 0 (negative direction magnetic field) | 1 (positive direction magnetic field) | 1 (>100 mA) |
| 1 (positive direction magnetic field) | 0 (negative direction magnetic field) | 1 (>100 mA) |
| 1 (positive direction magnetic field) | 1 (positive direction magnetic field) | 0 (36.1 mA) |

As described above, it is possible to perform all AND, OR, NOR, and NAND operations using the logic device of FIG. 8. Therefore, a reconfigurable semiconductor logic device capable of performing four logical operations can be implemented, thereby achieving high integration of the logic device and improvement of the operation speed thereof.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A reconfigurable logic device, comprising:
   at least one semiconductor device; and
   a pair of magnetic field controlled devices respectively spaced apart from both sides of the semiconductor device and that are adapted to generate magnetic field leakage to control the semiconductor device,
   wherein the semiconductor device includes
   a first semiconductor layer, and
   a second semiconductor layer located on the first semiconductor layer, and
   wherein one of the first semiconductor layer and the second semiconductor layer is a p-type semiconductor layer and the other is an n-type semiconductor layer.

2. The reconfigurable logic device of claim 1, wherein at least one magnetic field controlled devices of the pair of magnetic field controlled devices comprises:
   a first magnetic layer having a fixed magnetization direction;
   a non-magnetic layer located on the first magnetic layer; and
   a second magnetic layer located on the non-magnetic layer and having a reversible magnetization direction.

3. The reconfigurable logic device of claim 2, wherein the magnetic field leakage application direction is substantially perpendicular to the electric field generation directions.

4. The reconfigurable logic device of claim 1, wherein an electron carrier concentration in the first and second semiconductor layers increases by an impact ionization process, the electron carrier concentration decreases by recombination of holes and electrons at the interface of the first and second semiconductor layers to change the recombination according to a direction to which the magnetic field leakage is applied, and electric fields of the first and second semiconductor layers are generated in opposite directions to each other by the magnetic field leakage.

5. The reconfigurable logic device of claim 4, wherein the first and second semiconductor layers include InSb.

6. The reconfigurable logic device of claim 1, wherein a distance between at least one of the magnetic field controlled devices of the pair of magnetic field controlled devices and the semiconductor device is more than 0 nm and not more than 500 nm.

7. The reconfigurable logic device of claim 1, wherein current is injected into the magnetic field controlled devices through the first magnetic layer, the non-magnetic layer, and the second magnetic layer, and the current injection direction is reversible.

8. The reconfigurable logic device of claim 1, further comprising a shielding structure in contact with the semiconductor device and the pair of magnetic field controlled devices to block the magnetic field leakage from being leaked outside.

9. The reconfigurable logic device of claim 1, wherein the at least one semiconductor device includes two semiconductor devices connected to each other in a parallel manner,
   wherein one of the two semiconductor devices includes a p-type semiconductor layer and an n-type semiconductor layer located thereon, and the other of the two semiconductor devices includes an n-type semiconductor layer and a p-type semiconductor layer located thereon.

10. The reconfigurable logic device of claim 9, further comprising two power sources respectively connected to the two semiconductor devices.

11. The reconfigurable logic device of claim 1, wherein the at least one semiconductor device includes a pair of the same first semiconductor devices and a pair of the same second semiconductor devices,
   wherein the pair of the same first semiconductor devices and the pair of the same second semiconductor devices are connected to each other in a parallel manner, and
   wherein one pair of the pair of the same first semiconductor devices and the pair of the same second semiconductor devices includes a p-type semiconductor layer and an n-type semiconductor layer located thereon, and the other pair of the pair of the same first semiconductor devices and the pair of the same second semiconductor devices includes an n-type semiconductor layer and a p-type semiconductor layer located thereon.

12. The reconfigurable logic device of claim 1, wherein the p-type first semiconductor layer has a thickness of not more than 10 μm.

13. The reconfigurable logic device of claim 1, wherein the n-type second semiconductor layer has a thickness in a range of 0.1 μm to 10 μm.

14. A method for controlling a reconfigurable logic device, the method comprising:
   providing at least one semiconductor device;
   providing a pair of magnetic field controlled devices on both sides of the semiconductor device, the pair of magnetic field controlled devices being spaced apart from the semiconductor device; and generating a magnetic field by the magnetic field controlled devices to control the semiconductor device, wherein the providing of the at least one semiconductor device comprises providing a first semiconductor layer and providing a second semiconductor layer on the first semiconductor layer, and wherein one of the first semiconductor layer and the second semiconductor layer is a p-type semiconductor layer and the other of the first semiconductor layer and the second semiconductor layer is an n-type semiconductor layer.

15. The method of claim 14, wherein the magnetic field is applied to the semiconductor device in a positive direction or a negative direction along a direction parallel with the surface of the semiconductor device.

16. The method of claim 15, further comprising applying a voltage to the semiconductor device, wherein the voltage applied to the semiconductor device is higher than a threshold voltage of the semiconductor device when the positive direction magnetic field is applied and lower than a threshold voltage of the semiconductor device when the negative direction magnetic field is applied.

17. The method of claim 16, wherein the first semiconductor layer of the semiconductor device is an n-type semiconductor and the second semiconductor layer thereof is a p-type semiconductor.

18. The method of claim 17, wherein the at least one semiconductor device includes two semiconductor devices serially connected to each other in the providing of at least one semiconductor device, wherein the amount of current of the reconfigurable semiconductor logic device when the positive direction magnetic field is applied to both of the two semiconductor devices is greater than the amount of current of the reconfigurable semiconductor logic device when the negative direction magnetic field is applied to at least one of the two semiconductor devices.

19. The method of claim 17, wherein the at least one semiconductor device includes two semiconductor devices serially connected to each other in the providing of at least one semiconductor device, wherein the amount of current of the reconfigurable semiconductor logic device when the negative direction magnetic field is applied to both of the two semiconductor devices is less than the amount of current of the reconfigurable semiconductor logic device when the positive direction magnetic field is applied to at least one of the two semiconductor devices.

20. The method of claim 16, wherein the at least one semiconductor device includes two semiconductor devices connected to each other in a parallel manner in the providing of at least one semiconductor device, wherein one of the two semiconductor devices includes a p-type semiconductor layer and an n-type semiconductor layer located thereon, and the other includes an n-type semiconductor layer and a p-type semiconductor layer located thereon, and wherein a voltage is applied only to the semiconductor device including the n-type semiconductor layer located on the p-type semiconductor layer among the two semiconductor devices, and the amount of current of the reconfigurable semiconductor logic device when the negative direction magnetic field is applied to the semiconductor device is less than the amount of current of the reconfigurable semiconductor logic device when the positive direction magnetic field is applied to the semiconductor device.

21. The method of claim 16, wherein the at least one semiconductor device includes two semiconductor devices connected to each other in a parallel manner in the providing of at least one semiconductor device, wherein one of the two semiconductor devices includes a p-type semiconductor layer and an n-type semiconductor layer located thereon and the other includes an n-type semiconductor layer and a p-type semiconductor layer located thereon, and wherein a voltage is applied only to the semiconductor device including the p-type semiconductor layer located on the n-type semiconductor layer among the two semiconductor devices, and the amount of current of the reconfigurable semiconductor logic device when the positive direction magnetic field is applied to the semiconductor device is less than the amount of current of the reconfigurable semiconductor logic device when the negative direction magnetic field is applied to the semiconductor device.

22. The method of claim 15, further comprising applying a voltage to the semiconductor device, wherein the voltage applied to the semiconductor device is higher than a threshold voltage of the semiconductor device when the negative direction magnetic field is applied and lower than a threshold voltage of the semiconductor device when the positive direction magnetic field is applied.

23. The method of claim 22, wherein the first semiconductor layer of the semiconductor device is a p-type semiconductor layer and the second semiconductor layer thereof is an n-type semiconductor layer.

24. The method of claim 15, further comprising applying a voltage to the semiconductor device, wherein the voltage applied to the semiconductor device is higher than a threshold voltage of the semiconductor device when the negative direction magnetic field is applied and lower than a threshold voltage of the semiconductor device when the positive direction magnetic field is applied.

25. The method of claim 24, further comprising providing a pair of reconfigurable semiconductor logic devices serially connected to each other, wherein the at least one semiconductor device includes two semiconductor devices serially connected to each other in the providing of at least one semiconductor device, wherein a voltage is applied only to the semiconductor device including the p-type semiconductor layer located on the n-type semiconductor layer among the two semiconductor devices, and wherein the amount of current of the reconfigurable semiconductor logic device when the negative direction magnetic field is applied to both of the two semiconductor devices is greater than the amount of current of the reconfigurable semiconductor logic device when the positive direction magnetic field is applied to at least one of the two semiconductor devices.

26. The method of claim 24, further comprising providing a pair of reconfigurable semiconductor logic devices serially connected to each other, wherein the at least one semiconductor device includes two semiconductor devices serially connected to each other in the providing of at least one semiconductor device, wherein a voltage is applied only to the semiconductor device including the p-type semiconductor layer located on the n-type semiconductor layer from the two semiconductor devices, and wherein the amount of current of the reconfigurable semiconductor logic device when the positive direction magnetic field is applied to both of the two semiconductor devices is less than the amount of current of the reconfigurable semiconductor logic device when the negative direction magnetic field is applied to at least one of the two semiconductor devices.

27. The method of claim 24, wherein the providing of the pair of magnetic field controlled devices comprises:

providing a first magnetic layer having a fixed magnetization direction;

providing a non-magnetic layer on the first magnetic layer; and providing a second magnetic layer having a reversible magnetization direction on the non-magnetic layer, wherein the direction of current sequentially injected into the magnetic field controlled devices through the first magnetic layer, the non-magnetic layer, and the second magnetic layer is reversed.

* * * * *